United States Patent
Tweed et al.

[11] Patent Number: 5,923,597
[45] Date of Patent: *Jul. 13, 1999

[54] DYNAMICALLY VARIABLE DIGITAL DELAY LINE

[75] Inventors: David B. Tweed, Chelmsford; William W. Rollins, Wrentham, both of Mass.

[73] Assignee: Harris Corporation, Melbourne, Fla.

[*] Notice: This patent is subject to a terminal disclaimer.

[21] Appl. No.: 08/979,200

[22] Filed: Nov. 26, 1997

Related U.S. Application Data

[63] Continuation of application No. 08/756,242, Nov. 26, 1996, Pat. No. 5,818,769.

[51] Int. Cl.$^6$ .................................................. G11C 7/00
[52] U.S. Cl. ............................................ 365/194; 365/239
[58] Field of Search ................................. 365/194, 239, 365/240

[56] References Cited

U.S. PATENT DOCUMENTS

| | | | |
|---|---|---|---|
| 3,838,221 | 9/1974 | Schmidt et al. | 179/15 BS |
| 5,060,240 | 10/1991 | Erickson et al. | 375/38 |
| 5,452,333 | 9/1995 | Guo et al. | 375/371 |
| 5,486,930 | 1/1996 | Iketani et al. | 358/335 |

*Primary Examiner*—David Nelms
*Assistant Examiner*—M. Tran
*Attorney, Agent, or Firm*—Lappin & Kusmer LLP

[57] ABSTRACT

A dynamically variable digital delay line includes a storage element, write control circuitry, read control circuitry and output rate control circuitry. Generally, the invention applies a predetermined throughput delay to a series of digital data elements by entering each digital data element into a storage element for an amount of time equal to the desired throughput delay, then extracting each digital data element and returning it to the original data path. While operating with a constant predetermined delay, the invention extracts digital data elements from the storage element at the same rate as digital data elements are entered into the storage element. When a change to the throughput delay is required, the invention changes the digital data element extraction rate with respect to the digital data element entry rate until the desired throughput delay is achieved. During the transition period from one throughput delay to another, the only effect to the series of digital data elements at the output of the invention is a variation of the digital data element period. The invention limits variation of the digital data element period to comply with system specifications, so the throughput delay change is accomplished without affecting the integrity of the series of digital data elements.

12 Claims, 7 Drawing Sheets

DYNAMICALLY VARIABLE DIGITAL DELAY LINE

CROSS-REFERENCE TO RELATED APPLICATIONS

This Application is a continuation of application Ser. No. 08/756,242 filed Nov. 26, 1996, now U.S. Pat. No. 5,818,769.

FIELD OF THE INVENTION

The present invention relates to devices for delaying digital data, and more particularly to a device for delaying digital data whose delay can be changed dynamically without a loss of data or introduction of gaps in the data stream.

BACKGROUND OF THE INVENTION

Devices for delaying digital data are commonly referred to as digital delay lines. In general, a digital delay line receives a series of digital data elements S(n), as shown in FIG. 1A, where n is an integer, for all n from 1 to MAX, where MAX is an integer designating the end of the digital data series. Each digital data element can be a single bit or a multiple bit packet. The series of digital data elements can equivalently be expressed as a continuous function of time SC(t), as shown in FIG. 1B. The value of SC(t) changes abruptly at t==nT and maintains a constant value of S(nT) from nT<t<(n+1)T, for all n from 1 to MAX, where T is the time between consecutive digital data elements. The digital delay line produces SC(t−$\tau$), which is a delayed version of SC(t), where $\tau$ is the amount of delay through the digital delay line. In general, $\tau$ can be any non-zero value, but prior art embodiments of digital delay lines often limit $\tau$ to an even multiple of T.

Digital delay lines have many applications in electronic systems. For example, digital filters use digital delay lines to generate a set of delayed versions of a common series of digital data elements. Each version is scaled, and the set of scaled, delayed digital data elements are summed to accomplish the filtering. Such filters typically use digital delay lines with $\tau$'s less than 10T, which can be implemented with edge-triggered D-type or J–K flip-flops.

Some applications require a delay having a $\tau$ of 1000T or more. In such cases, the use of flip-flops is inefficient, due to the length of the delay and/or the number of data bits in each data element. As an example, consider an application which requires a running average of 512 data elements of a series of digital data elements. An implementation of such an averaging function is to duplicate the series of digital data elements, send the original series into an accumulator, and send the duplicate into a delay line with a $\tau$ of 512T. The output of the delay line is subtracted from the accumulator so that the accumulator's output is always the sum of the 512 data elements in the delay line. If each data element of the series of digital data elements is 8 bits wide, implementing the delay line with flip-flops would require 512 times eight, or 4096 flip-flops, each clocked with a clocking signal having a frequency of 1/T.

A prior-art alternative to using flip-flops to implement the 512 data element digital delay line is to enter each data element of the series in a digital data storage device such as a RAM, then extract each data element at a later time, so that the amount of time the data element remains in the RAM is equal to the desired delay. Such a function can be implemented using a 512 by eight bit RAM and a nine bit, modulo 512 address counter. A clocking signal increments the counter at a frequency of 1/T, so that the address to the RAM changes for each new data element available. For each address, the old value entered into the addressed location is extracted before the new data element is entered. Since the counter is modulo 512, a first data element entered into the RAM won't be extracted from the RAM until 511 subsequent data elements are entered into all of the subsequent RAM locations. When the $512^{th}$ data element is available, the first data element is extracted from RAM, subjecting the first data element to an effective delay of 512T.

The RAM and counter architecture is efficient in terms of hardware requirements, but it lacks versatility. If the entry and extraction addresses are fixed relative to each other as described in the previous paragraph, the resolution of the delay is limited to T. The maximum delay is bounded by the size of the RAM. The length of the delay can be shortened if the modulo of the counter is changed to a value smaller than the total number of address locations in the RAM. However, if the counter's modulo is changed to a smaller value while a series of digital data elements is being delayed, a set of consecutive data elements from the series of digital data elements will be excised from the output series of delayed digital data elements. When the counter modulo changes, a portion of the RAM is no longer used, and the data elements stored in those locations when the modulo is changed will no longer be accessed, and will be missing from the delayed series of digital data elements.

Similarly, when the length of the delay line is increased, the portion of RAM which was not being used prior to the increase is accessible. The data elements extracted for the first time after increasing the counter modulo are undefined with respect to the delayed series of digital data elements. The undefined data effectively creates a gap of undefined data elements in the delayed series of digital data elements.

Many applications cannot tolerate such a corruption of a series of digital data elements. An example of such an application is a transmitter distribution network for a mobile radio system, in which a single source distributes information to several transmitter stations. For optimum performance of the system, the phase of the distributed data should be the same at each transmitter station, which can only be accomplished if the delay path lengths of the data links from the central source to each of the transmitter stations are the same. When a commercial network is used to distribute the data, the longest delay path is determined using methods known to those skilled in the art, and delay lines such as the invention are inserted in the shorter delay paths to equalize the delays. Due to equipment malfunction or natural disaster, the data link with the longest delay path can be disrupted. To remedy such a situation, the commercial network will re-route the failed data link. The new, re-routed data path is unlikely to have the same delay as the path used prior to the disruption, so the longest path must again be determined and the shorter paths must again be equalized. Use of prior art delay lines in such an application will either create a gap in the series of digital data elements or excise data from the series of digital data elements, depending upon whether the delay is lengthened or shortened. Either result will degrade the communications link.

There is a need for a digital delay line whose delay length can be changed while processing a series of digital data elements without disrupting the series of digital data elements by either losing data or creating a gap of undefined data elements in the series.

It is therefore an object of the invention to provide an improved digital delay line whose delay length can be changed while processing a series of digital data elements without disrupting the series of digital data elements by either excising data or creating a gap.

Other objects and advantages of the present invention will become apparent upon consideration of the appended drawings and description thereof.

SUMMARY OF THE INVENTION

The foregoing and other objects are achieved by the invention which in one aspect comprises a dynamically variable digital delay line. In the preferred embodiment, the delay line includes a storage element, write control circuitry, read control circuitry and output rate control circuitry. Generally, the invention delays a series of digital data elements by storing each data element in the storage element for an interval corresponding to the desired throughput delay, then retrieving each data element and returning it to the original data path. While operating with a constant delay, the invention removes data elements from the storage element at the same rate as data elements are stored in the storage element.

When a change to the throughput delay is indicated by a change to the desired throughput delay input, the invention changes the data element removal rate with respect to the data element storage rate until the desired throughput delay is achieved. In the preferred form of the invention, the change to the removal rate is limited to a predetermined maximum value. The limitation ensures that during the transition period from one throughput delay to another, the only effect to the series of digital data elements at the output of the invention is a variation of the data element period so the throughput delay change is affected without harming the integrity of the series of digital data elements. The magnitude of the data element period variation is bounded by the removal rate limitation, so that the resulting data element period complies with system specifications.

In another form of the invention, the value of the removal rate limitation is controlled so that although some degradation to the integrity of the digital data element series occurs, the extent of the degradation is less than when no limit to the removal rate is imposed.

In the preferred form of the invention, the storage element includes a Static Random Access Memory device.

The write control circuitry includes an input buffer to receive the digital data elements from the source, a data packet compiler to re-format the input digital data elements for the storage device, and addressing circuitry to coordinate the storage of the digital data elements.

The read control circuitry includes a de-compiler to return the data to the form provided by the source, addressing circuitry to coordinate the retrieval of the digital data elements from the storage device, and an output buffer to return the digital data elements to the system data path.

The output rate control circuitry monitors the input operations performed by the write control circuitry and the output operations performed by the read control circuitry and compares the actual throughput delay to the desired throughput delay. When the output rate control circuitry detects a difference between the actual throughput delay and the desired throughput delay, the output rate control circuitry changes the retrieval rate of the read control circuitry until the difference is eliminated.

BRIEF DESCRIPTION OF DRAWINGS

The foregoing and other objects of this invention, the various features thereof, as well as the invention itself, may be more fully understood from the following description, when read together with the accompanying drawings in which.

Like numbered elements in each FIGURE represent the same or similar elements.

DESCRIPTION OF THE PREFERRED EMBODIMENTS

Figure 1A:
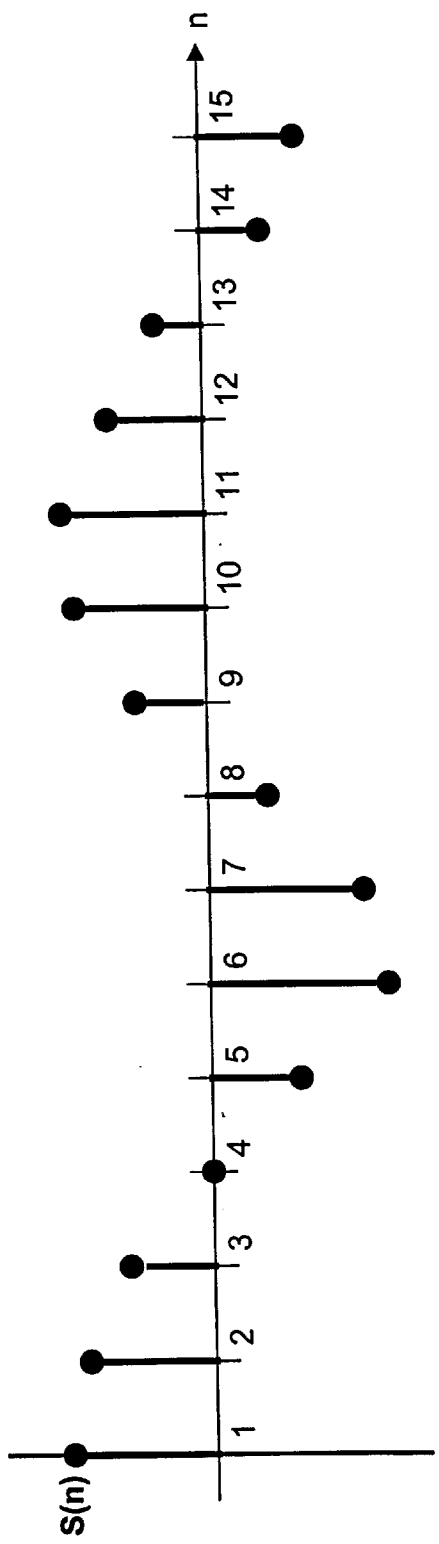
FIG. 1A illustrates a discrete timing diagram of a series of digital data elements.
Figure 1B:
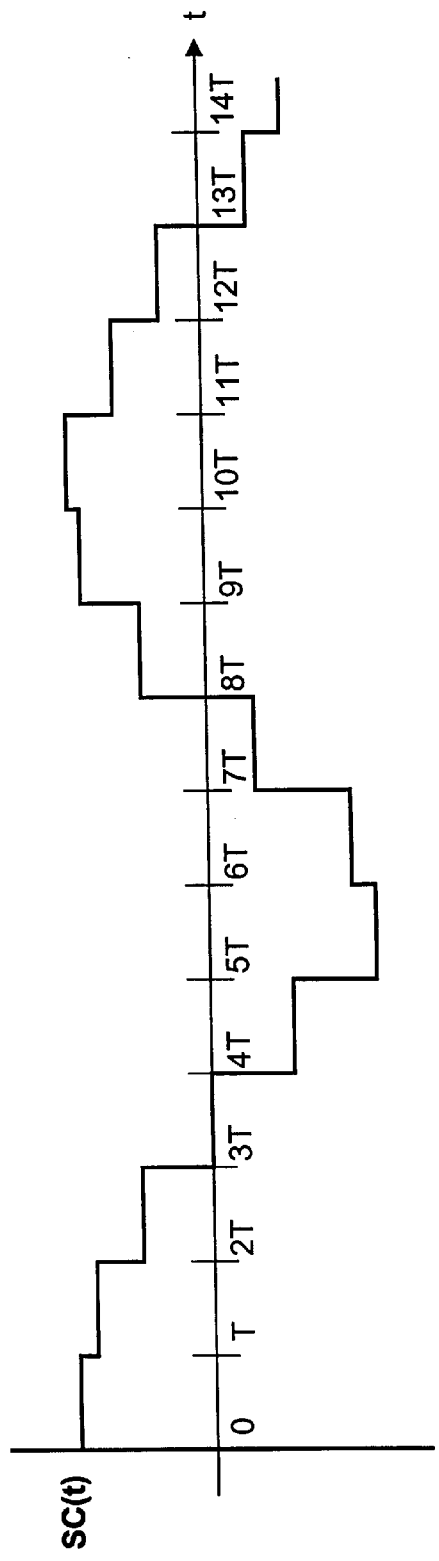
FIG. 1B illustrates a continuous timing diagram of the series shown in FIG. 1B.
Figure 2A:
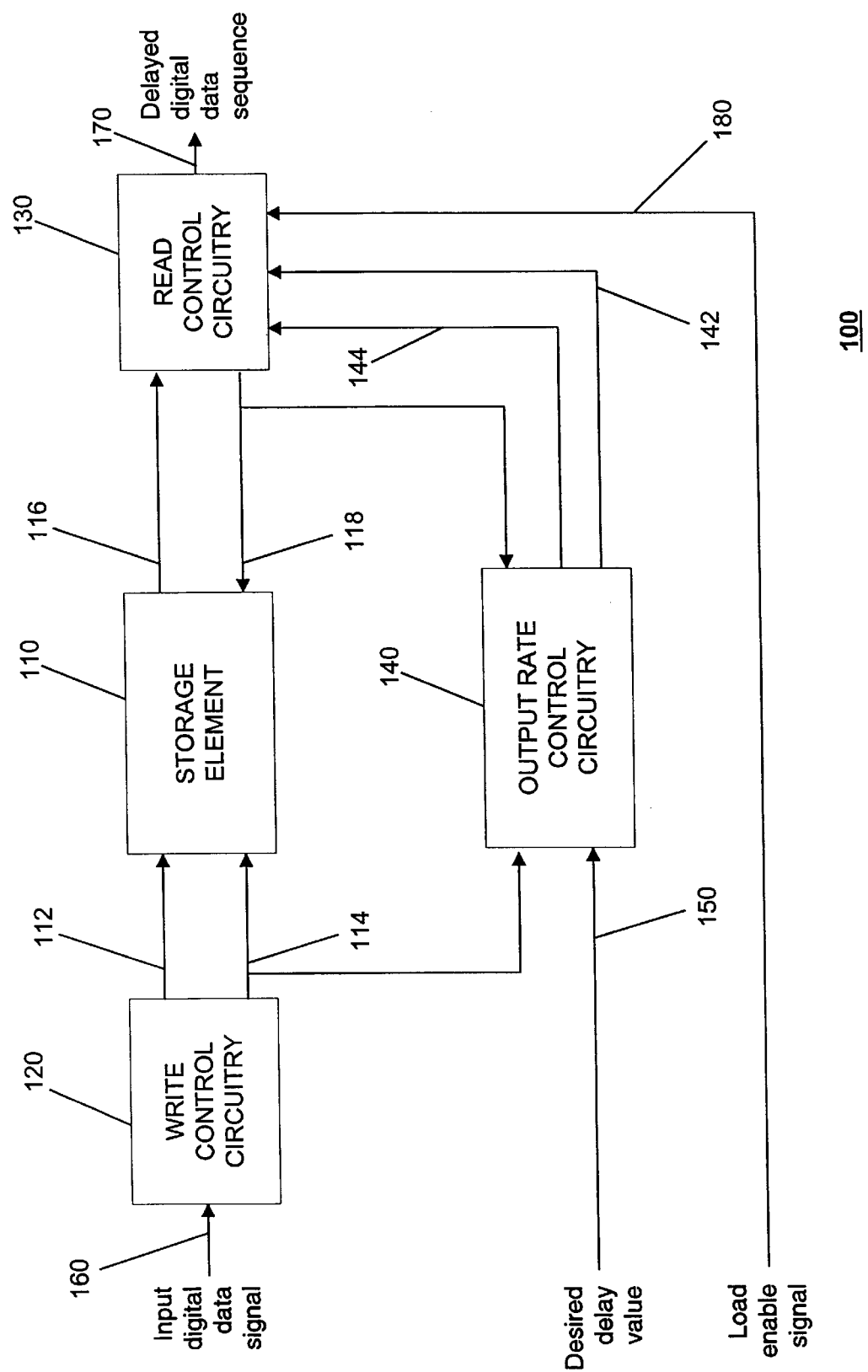
FIG. 2A is a block diagram of a dynamically variable digital delay line constructed according to the invention.
Figure 2B:
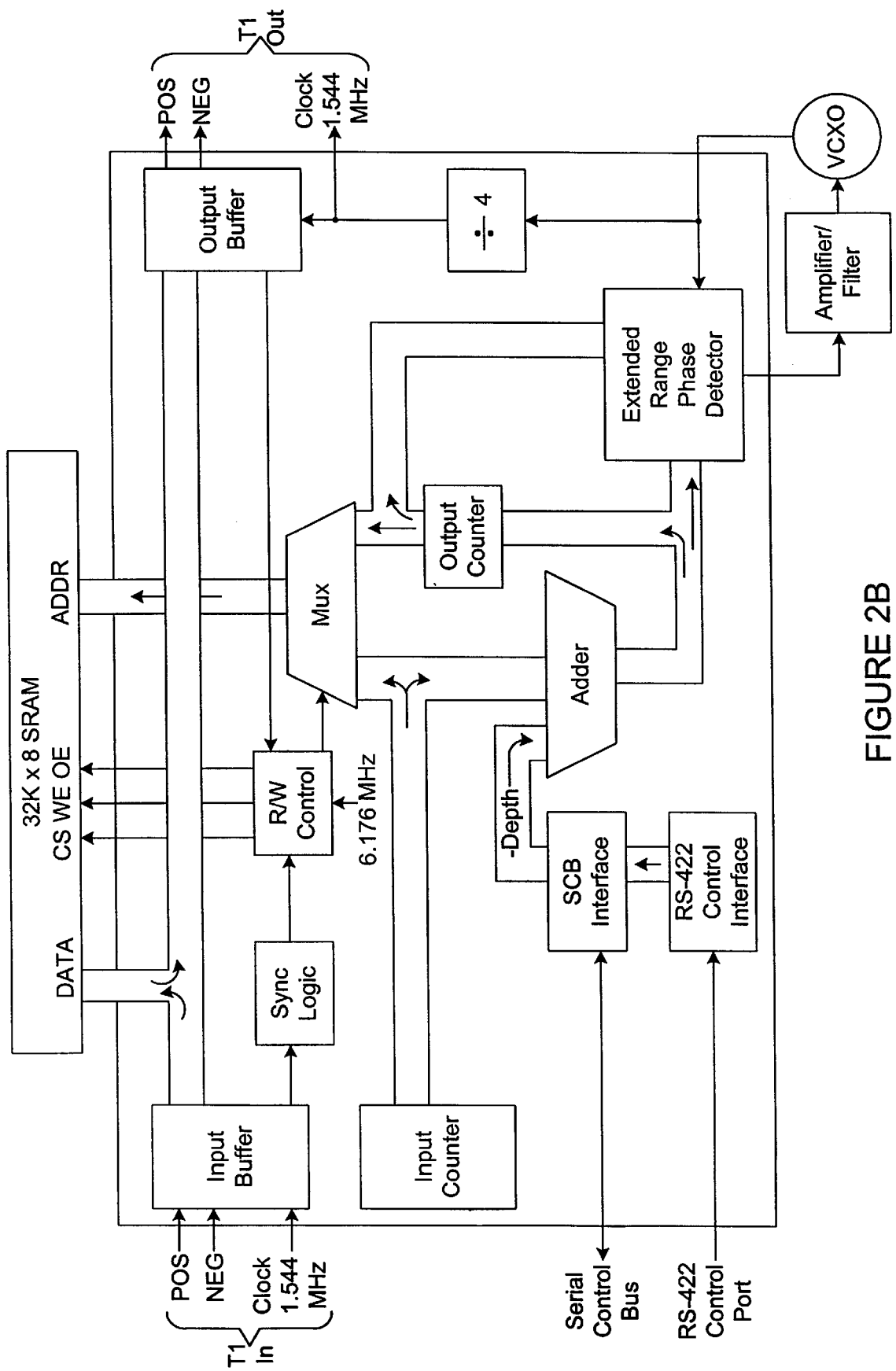
FIG. 2B is a block diagram of an alternate embodiment of the invention shown in FIG. 2A.

FIG. 2A shows a block diagram of a preferred embodiment of a dynamically variable digital delay line 100 constructed according to the present invention. Delay line 100 includes a storage element 110, write control circuitry 120, read control circuitry 130 and output rate adjustment circuitry 140. FIG. 2B shows an alternative embodiment of a dynamically variable digital delay line, including implementation details of various elements.

In the preferred embodiment, the storage element 110 is a single port Static Random Access Memory (hereinafter referred to as SRAM), although those skilled in the art will appreciate that other implementations such as Dynamic Random Access Memory or digital logic flip-flops may be used.

The write control circuitry 120 receives an input series of digital data elements on the receive bus 160 at a rate determined by the source of the input series of digital data elements. The write control circuitry 120 converts the input series of digital data elements to write data packets compatible with the data width constraints of the storage element 110, then supplies the write data packets to the storage element 110 via the input data bus 112. The write control circuitry 120 generates the write address and control signals necessary to enter the write data packets in the correct storage element locations. The write address and control signals are provided to the storage element 110 via write control bus 114.

The read control circuitry 130 generates the read address and control signals necessary to extract the stored data packets from the storage element 110. The read address and control signals are provided to the storage element 110 via read control bus 118. The read control circuitry 130 removes stored data packets from storage element 110 at a time and rate determined by the output rate control circuitry 140, and receives the data packets via read data bus 116. The read control circuitry converts the stored data packets back to the format received from the input source, and applies the delayed digital data elements to the output bus 170 to form a series of delayed digital data elements.

The output rate control circuitry 140 receives a desired delay value on delay value bus 150, the write address and control signals on write control bus 118, and the read address and control signals on read control bus 114. The output rate control circuitry 140 uses the signals on the delay value bus 150, the write control bus 118 and the read control bus 114 to generate an expected read address, which is applied to the expected read address bus 144, and to generate an output rate control signal, which is applied to the output rate control conductor 142. Both the expected read signal and the output rate control signal are received by the read control circuitry 130.

Figure 3:
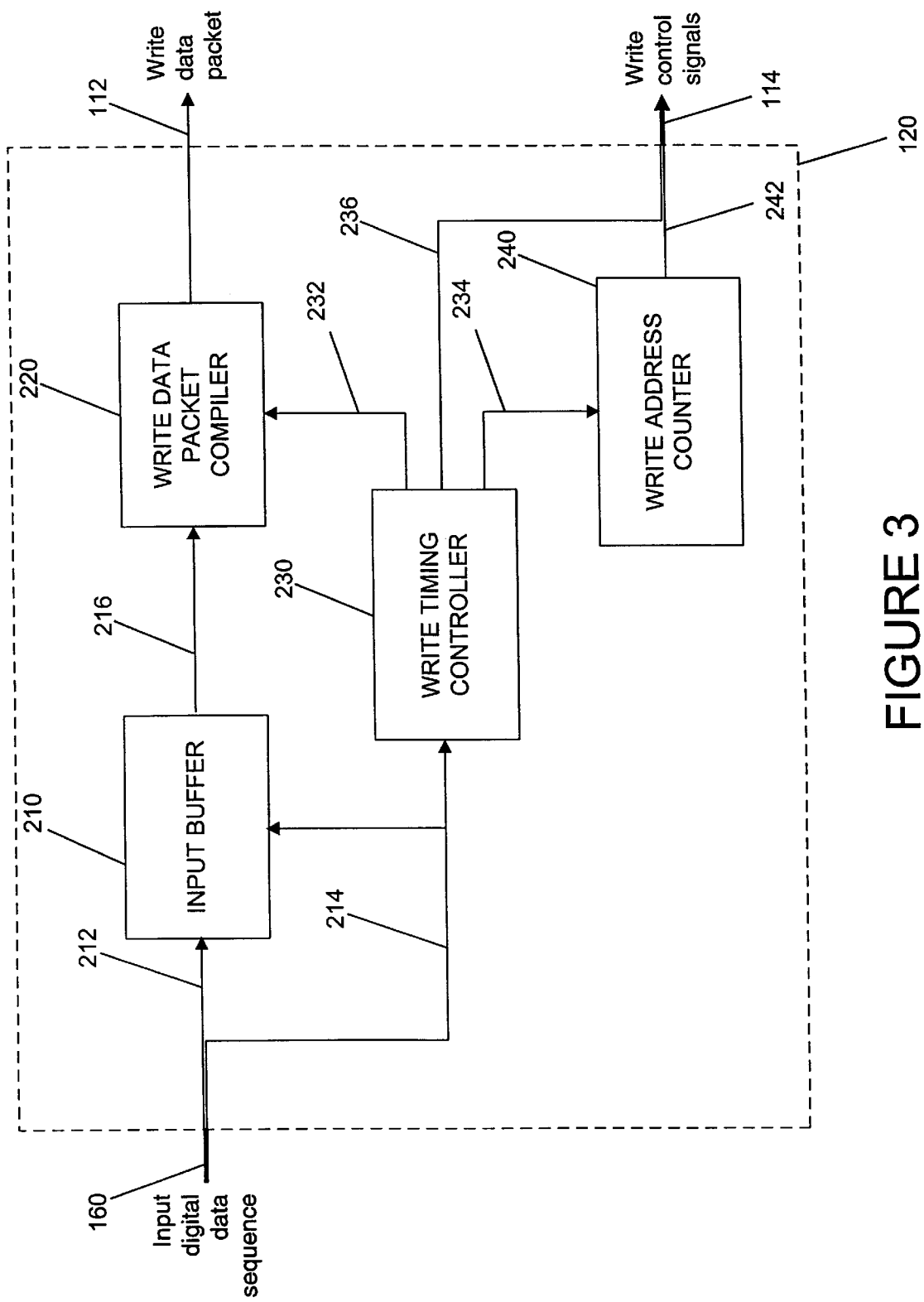
FIG. 3 is a block diagram of the write control circuitry as shown in FIG. 2A.

FIG. 3 shows a detailed block diagram of the write control circuitry 120. The write control circuitry includes an input buffer 210, a write data packet compiler 220, a write timing controller 230 and a write address counter 240. The input series of digital data elements on the receive bus 160 includes input data elements and an input timing signal. The input buffer 210 receives the input data elements via the input data bus 212. Both the input buffer 210 and the write timing controller 230 receive the input timing signal via input timing conductor 214. The input buffer 210 uses the input timing signal to determine when to capture a new input data element from the input data bus 212. When input buffer 210 captures a data element, the input buffer 210 applies the captured data element to the compiler bus 216, from which the input data packet compiler 220 receives the captured data element. The write data packet compiler 220 appends multiple input data elements to form a single write data packet of the same width as the storage device 110, then applies the write data packet to write data packet bus 112.

The preferred embodiment of this invention includes an eight bit wide by 32,000 location deep SRAM storage device 110, and the input series of digital data elements on receive bus 160 is two bits wide. In operation, the input data packet compiler 220 appends every four consecutive data elements of the input series of digital data elements to form an eight bit input data packet, which is entered in the SRAM storage device 110.

The write timing controller 230 uses the input timing signal on input timing conductor 214 to generate a captured data element timing signal on captured data element timing conductor 232, which triggers the input data packet compiler 220 to accept a new captured data element only after the captured data element on compiler bus 216 has stabilized. Each time a complete data packet is formed by the input data packet compiler 220, the write timing controller 230 generates a write enable signal applied to write enable conductor 236, followed by a write address increment signal applied to the write address increment conductor 234. The write address counter 240 applies the current write address to the current write address bus 242, which combined with the write enable conductor 236 forms the write control bus 114. When the storage device 110 receives the write enable signal via write enable conductor 236, the storage device 110 enters the write data packet from write data packet bus 112 in the location indicated by the address count on write address bus 242. The write timing controller 230 increments the write address counter 240 with the write address increment signal after the write data packet has been stored.

Figure 4:
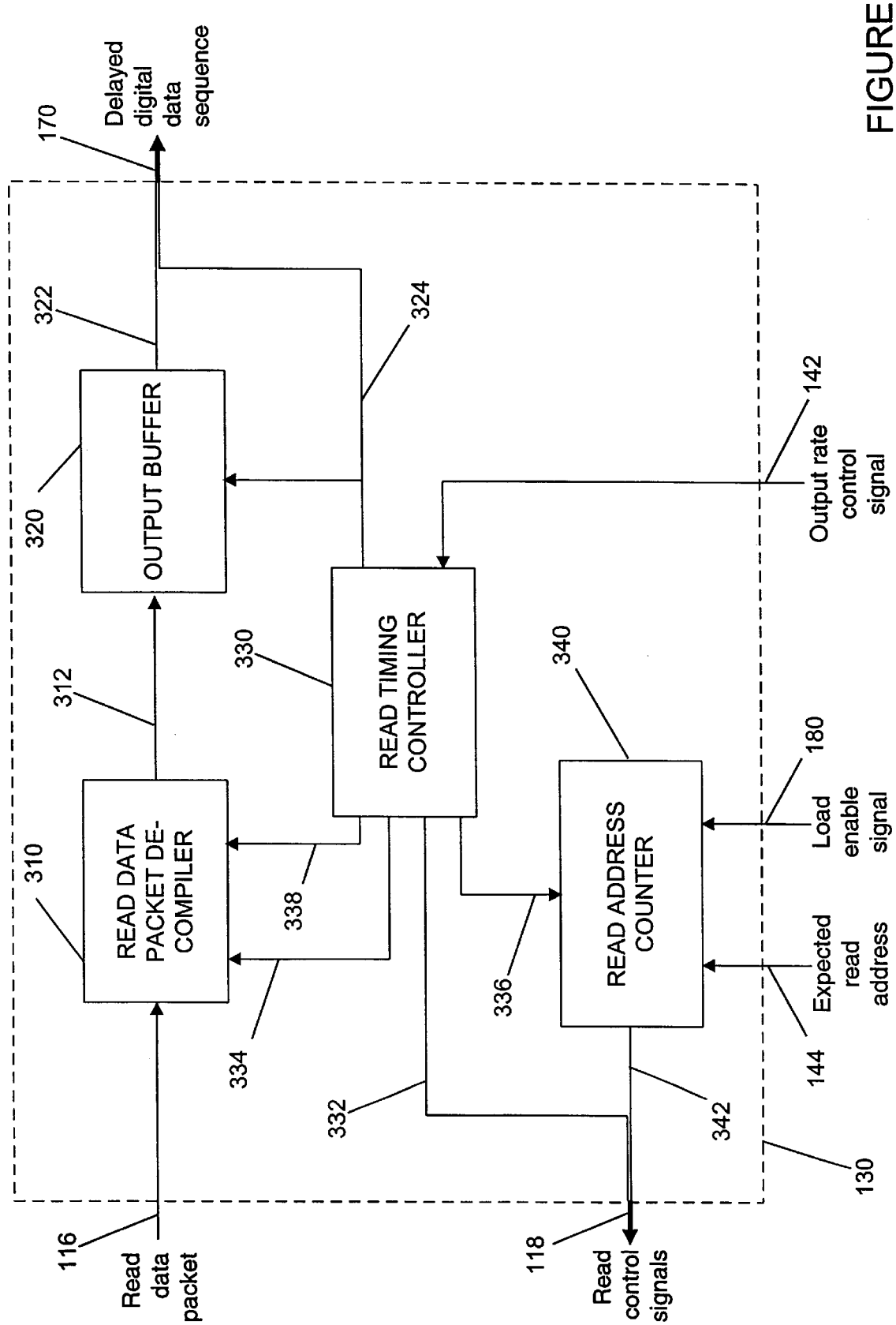
FIG. 4 is a block diagram of the read control circuitry as shown in FIG. 2A.

FIG. 4 shows a detailed block diagram of the read control circuitry 130. The read control circuitry 130 includes a read data packet de-compiler 310, an output buffer 320, a read timing controller 330, and a read address counter 340. The read control circuitry 130 retrieves read data packets from the storage element 110 and disassembles each read data packet into the constituent read data elements.

A read data packet is extracted from the storage element 110 when the read timing controller 330 receives an output rate control signal from the output rate control circuitry 140 via output rate control conductor 142. Upon receipt of an output rate control signal, the read timing controller generates a read enable signal on the read enable conductor 332. The read address counter 340 applies the current read address to read address bus 342, which combined with the read enable conductor 332 forms the read control bus 118. When the storage device 110 receives the read enable signal via the read enable conductor 332, the storage device 110 extracts the read data packet from the location indicated by the current read address on current read address bus 242 and applies it to the read data packet bus 116. The read timing controller 330 applies an output packet timing signal to the output packet timing conductor 334 when the data packet on data packet bus 116 is available. The read data packet de-compiler 310 receives the output packet timing signal and responds by capturing the read data packet on read data packet bus 116. After the read data packet is captured by read data packet de-compiler 310, the read timing controller 330 applies a read address increment signal to read address increment conductor 336. The read address counter 340 receives read address increment signal and responds by incrementing the current read address. The read data packet de-compiler 310 separates each read data packet into its constituent read data elements. Each read data packet is applied to de-compiler bus 312 when triggered by the output element timing signal applied to the output element timing conductor 338 by the read timing controller 330. Each read data element applied to the de-compiler bus 312 is captured by the output buffer 320 when triggered by an output timing signal applied to output timing conductor 324. The delayed data element captured by the output buffer 320 is applied to the delayed data bus 322, which combined with the output timing conductor 324 forms the output bus 170. The set of delayed data elements applied to delayed data bus 322 forms an output series of delayed digital data elements.

The read address counter 340 receives an expected read address signal on the expected read address bus 144 and a load enable signal on load enable conductor 180. The read address counter 340 sets the read address count to the expected read address when triggered by the load enable signal.

Figure 5:
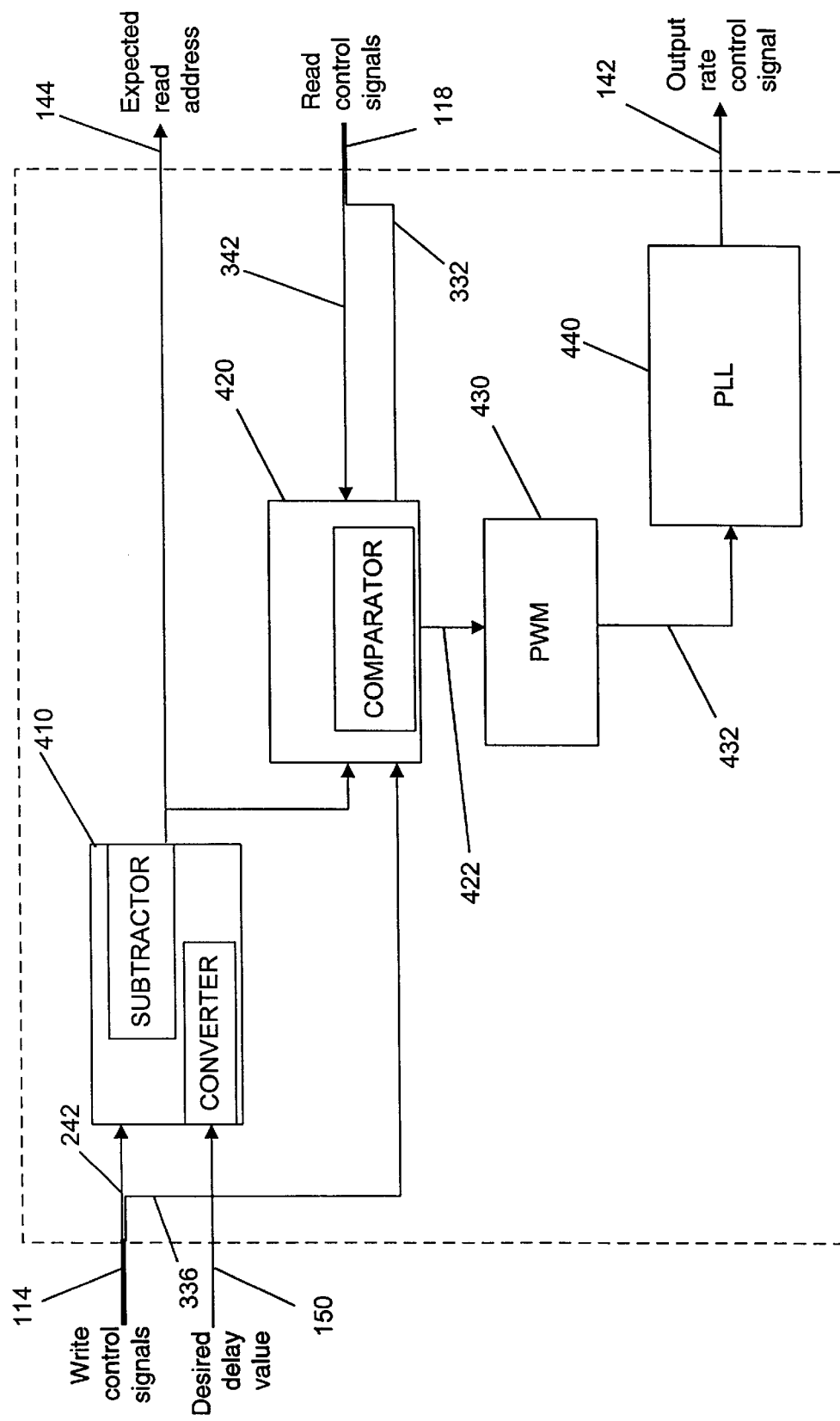
FIG. 5 is a block diagram of the output rate control circuitry as shown in FIG. 2A; and, FIG. 6 is a state table relating states of the error word with the error signal waveforms.

FIG. 5 shows a detailed block diagram of the output rate control circuitry 140. The output rate control circuitry includes an expected read address circuit 410, a error word circuit 420, a pulse width modulator (hereinafter referred to as PWM) 430 and a phase locked loop (hereinafter referred to as PLL) circuit 440. The expected read address circuit 410 receives the current write address via the write control bus and the desired delay value via the delay value bus 150, and subtracts the desired delay value from the current write address to produce an expected read address. The expected read address circuit 410 applies the result of the subtraction to the expected read address bus 144. The error word circuit 420 receives the expected read address via the expected read address bus 144, the write enable signal via the write enable conductor 236, the current read address via the current read address bus 342 and the read enable signal via read enable conductor 332. The error word circuit 420 subtracts the expected read address from the current read address to establish a coarse difference value. In one form of the invention, the resolution of the coarse difference value corresponds to a delay of four input element intervals, although those skilled in the art will appreciate that other resolution relationships are possible. The error word circuit 420 also compares the relative timing of the write enable signal to the read enable signal to establish a fine difference value. In the preferred embodiment of the invention, the resolution of the fine difference value is one sixteenth of the resolution of the coarse difference value, although those skilled in the art will appreciate that other resolution relationships are possible. The one-to-sixteen resolution relationship of the invention allows control of the amount of delay through the invention to a resolution of a single input element interval.

Figure 6:
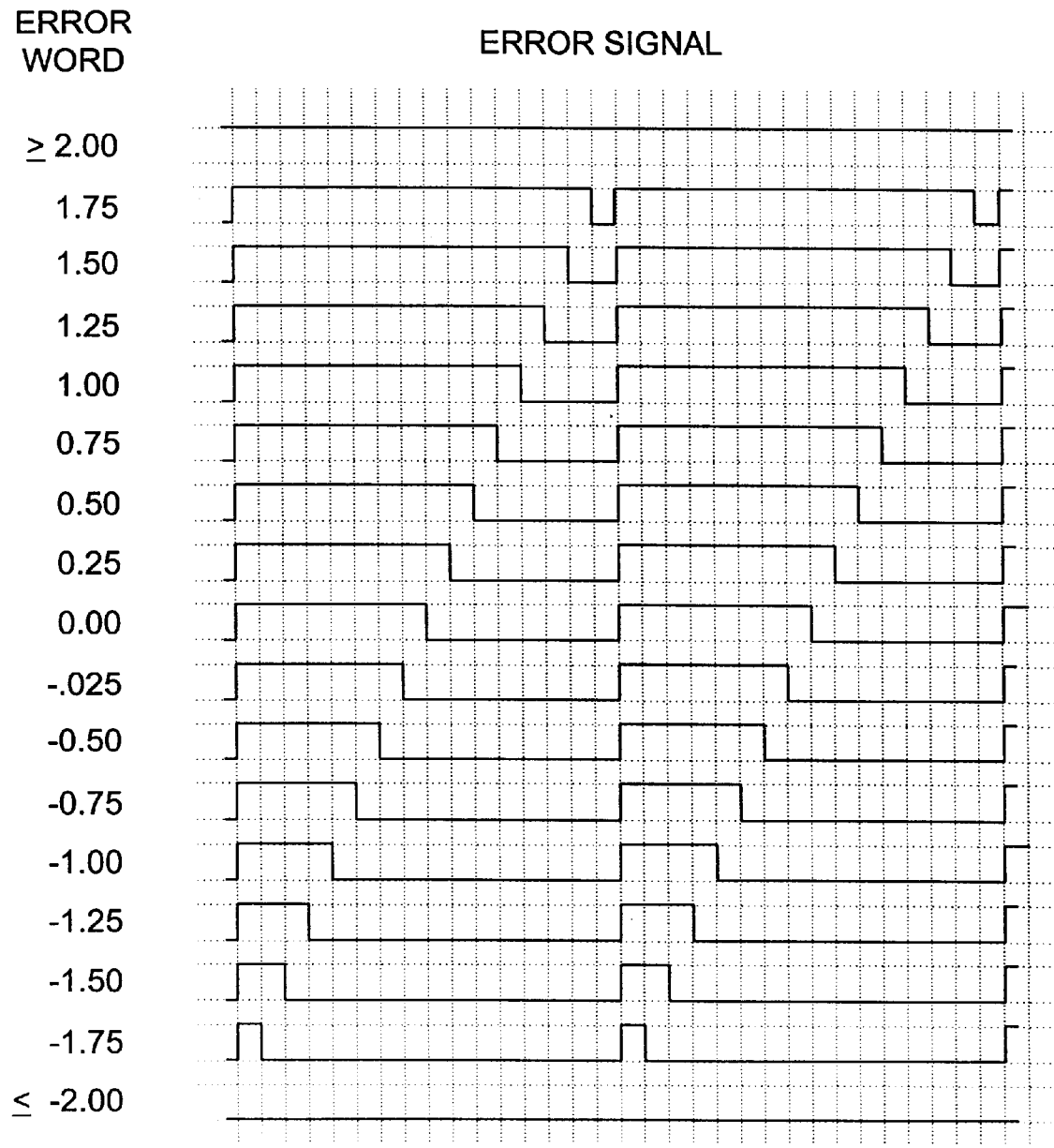

In general, the invention uses the coarse and fine difference values to adjust the amount of time each input data element remains in the invention by adjusting the output data element interval. By limiting the magnitude of the element interval adjustment, the invention effects a change to the through-put delay without interrupting the series of digital data elements. In one form of the invention, the error word circuit 420 combines the coarse difference value with the fine difference value to form an error word, and applies the error word to the PWM 430 via the error word bus 422. The error word defines a range which includes eight positive states, eight negative states and a zero state. The resolution of the error word is one quarter of the resolution of the input element interval, although other resolution relationships are possible. In general, the invention converts the digital error word into an analog error signal which is used to drive the PLL 440. In the preferred embodiment of the invention, the PWM 430 produces an error signal on the error conductor 432, which is modulated between a "low" value and a "high" value so that it has a duty cycle corresponding to the value of the error word, although those skilled in the art will appreciate that other architectures may be used to perform the same digital to analog conversion. FIG. 6 illustrates the preferred relationship between the error word and the error signal. When the error word is zero, the PWM produces an error signal with a 50% duty cycle. As the value of the error word changes in a positive direction, the duty cycle of the error signal increases until the error word reaches +2.00, at which point the error signal saturates at a constant "high". Any increase of the value of the error word above +2.00 holds the error signal at a constant "high". As the value of the error changes in a negative direction, the duty cycle of the error signal proportionally decreases until the error word reaches −2.00, at which point the error signal saturates at a constant "low". Any decrease of the error word below −2.00 holds the error signal at a constant "low".

The PLL 440 receives the error signal via error conductor 432, filters the error signal to tailor its frequency spectrum and uses the filtered signal to produce the output rate control signal. The output rate control signal is applied to the output rate control conductor 142.

The preferred embodiment of the invention normally operates in the hitless mode. The term "hitless" means that a delay change can be effected without losing data or creating a gap in the output series of delayed digital data elements. Prior to a delay change, the current read address on current read address bus 342 and the expected read address on expected read address bus 144 have the same value, which produces a zero-value error word. The PWM responds to a zero-value error word by applying an error signal with a 50% duty cycle to the error conductor 432. An error signal with a 50% duty cycle causes the PLL to produce an output rate control signal on the output rate control conductor 142 which regulates the read control circuitry 130 to remove data packets from the storage element at the same rate that the write control circuitry stores data packets. Each data element received from the input series of digital data elements and written to the storage device 110 remains in the storage device 110 for a fixed amount of time before being removed and applied to the delayed data bus 322.

Changing the desired delay value on the desired delay value bus 150 while the invention is in hitless mode produces a non-zero error word from the error word circuit 420. The PWM responds to a non-zero error word by applying a non-50% duty cycle error signal to the error conductor 432. The PLL 440 responds to the non-50% duty cycle error signal by changing the frequency of the output rate control signal, causing the read control circuitry to remove data packets from the storage device at either a faster or slower rate than they are being stored. The amount of time that each ensuing data element remains in the storage device 110 decreases or increases, depending upon whether the output rate control signal has increased or decreased in frequency. In the preferred embodiment of the invention, the output rate of the digital delay line is varied while the input rate is held constant to change the amount of delay. Those skilled in the art will recognize that alternative embodiments of the invention could vary the input rate while holding the output rate constant, or both the input rate and output rate could be varied simultaneously to effect a change in the amount of delay.

Whether the length of the delay increases or decreases depends upon whether the output rate control signal has increased or decreased in frequency. The rate of change of the delay length through the invention is directly proportional to magnitude of the frequency offset from nominal of the output rate control signal. As shown in FIG. 6, the error word saturates at +2.00 and −2.00, limiting the error signal, and consequently the rate of change of the delay through the invention.

The invention can also operate in "non-hitless" mode, during which a delay change can be initiated immediately when a loss of data in the series of digital data elements or a gap in the series of digital data elements can be tolerated. To initiate a delay change in non-hitless mode, the output rate control circuitry 140 receives a new desired delay value via delay value bus 150. The expected read address circuit subtracts the desired delay value from the current write address, and applies the resulting expected read address to the expected read address bus 144. When the read control circuitry 130 receives the load enable signal via the load enable conductor 180, the read address counter 340 captures the expected read address and thereafter uses the expected read address as the current read address.

One form of the invention includes synchronization circuitry 190 to coordinate the read/write control circuitry 195 during entry and extraction of data packets from the storage element 110, as shown in FIG. 2B. The synchronization circuitry 190 prevents data packet entries and extractions from occurring simultaneously, so that a RAM device with a single access port may be used. The synchronization circuitry 190 includes a modulo-16 counter which cycles through its sixteen states once for every data packet extracted from the storage element. The clocking signal to the modulo-16 counter is derived from the output of the PLL, so the extractions from the storage element are synchronized to the state of the modulo-16 counter. The data packet entries are asynchronous to the modulo-16 counter. When a data packet is ready to be entered into the storage element 110, the synchronization circuitry 190 samples the state of the modulo-16 counter. If the synchronization circuitry 190 determines from the state of the modulo-16 counter that the read/write control circuitry 195 is about to extract a data packet, the synchronization circuitry 190 postpones the data packet entry until after the data packet extraction.

The following description illustrates the synchronization circuitry 190 processing of the interaction between a data packet entry and a data packet extraction when no data packet entry postponement is necessary. The synchronization circuitry receives a data ready signal indicating that a data packet is ready to be entered into the storage element 110. If the modulo-16 counter state is anything except a '0', '1', '2' or '3', the write is allowed to occur immediately. In one example, the modulo-16 counter state is an 'F', so the write enable signal is asserted immediately, which causes a data packet to be entered into the storage element 110. The read enable signal is asserted following the write enable signal, which causes a data packet to be extracted from the storage element 110.

The following description illustrates the synchronization circuitry 190 postponing the entry of a data packet until a data packet has been extracted. The synchronization circuitry receives a data ready signal indicating that a data packet is ready to be entered into the storage element 110. If the modulo-16 counter state is a '0', '1', '2' or '3', the write enable signal is postponed until after the read enable signal is asserted.

The present embodiments are therefore to be considered in all respects as illustrative and not restrictive, the scope of the invention being indicated by the appended claims rather than by the foregoing description, and all changes which come within the meaning and band of equivalency of the claims are therefore intended to be embraced therein.

What is claimed is:

1. An apparatus for delaying a series of digital data elements, comprising:

A. a storage element for storing a plurality of digital data elements;

B. data entry means for entering said series of digital data elements into said storage element at a predetermined input rate;

C. extraction means for extracting, at a variable output rate, a succession of digital data elements of said series of digital data elements from said storage element, each extraction occurring at a delay time after an individual digital data element was stored in said storage element; and D. adjusting means for adjusting each of said delay times as a function of a desired delay value, wherein said function includes i. determining differences between each of said delay times and said desired delay value; and, ii. changing each of said delay times at a rate of change which is proportional to said differences, until each of said differences is less than a predetermined value, wherein said variable output rate varies by a frequency offset with respect to said predetermined input rate as a function of said differences.

2. An apparatus according to claim 1, wherein said rate of change is limited by a first predetermined maximum value and a magnitude of said frequency offset is limited by a second predetermined value, whereby the integrity of said succession of digital data elements is maintained within a predetermined tolerance.

3. An apparatus according to claim 2, wherein said storage element is selected from the group consisting of digital storage registers, D-type flip-flops, J/K type flip-flops and RAM devices.

4. An apparatus according to claim 3, wherein said storage element is a RAM device, and said data entry means further includes a write address counter for supplying a write address to said RAM device, a write data packet compiler for temporarily holding said individual digital data element of said series of digital data elements and supplying said individual element to said RAM device, and a write timing controller.

5. An apparatus according to claim 4, wherein said write control means supplies a write signal to said RAM device, said write signal causing said individual digital data element to be recorded in a RAM location indicated by said write address register.

6. An apparatus according to claim 5, wherein said write signal is supplied when said individual digital data element of said series of digital data elements is available in said write data register.

7. An apparatus according to claim 2, wherein said data entry means further includes means for combining a plurality of said individual digital data elements to form a composite data element to be recorded in said storage element.

8. An apparatus according to claim 7, wherein said extraction means further includes means for separating said composite data element into said plurality of individual digital data elements.

9. An apparatus according to claim 2, wherein said adjustment means further includes means for adjusting said predetermined input rate.

10. An apparatus according to claim 2, wherein said adjustment means further includes means for simultaneously adjusting said predetermined input rate and each of said delay times.

11. An apparatus according to claim 2, wherein said data extraction means extracts data from said storage element at a data extraction time, said data entry means enters data at a data entry time and includes means for adjusting said data entry time so that said data entry time does not coincide with said data extraction time.

12. An apparatus according to claim 1, wherein said rate of change is limited by a predetermined maximum value, whereby a loss of integrity of said succession of digital data elements is limited to an acceptable level.

* * * * *